United States Patent
Tagami et al.

[11] Patent Number: 6,060,819
[45] Date of Patent: *May 9, 2000

[54] PIEZOELECTRIC TRANSFORMER

[75] Inventors: Satoru Tagami; Koichi Zama; Tsuyoshi Kitami; Hiromi Suzuki; Takayuki Inoi, all of Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/873,196

[22] Filed: Jun. 11, 1997

[30] Foreign Application Priority Data

Jun. 18, 1996 [JP] Japan .................................. 8-156492
Jul. 17, 1996 [JP] Japan .................................. 8-187053

[51] Int. Cl.[7] .................. H01L 41/047; H01L 41/107; H02M 5/04
[52] U.S. Cl. .................................................. 310/366
[58] Field of Search ......................... 310/359, 365, 310/366

[56] References Cited

U.S. PATENT DOCUMENTS

| 3,736,446 | 5/1973 | Berlincourt et al. | 310/359 |
|---|---|---|---|
| 5,365,141 | 11/1994 | Kawai et al. | 310/359 |
| 5,571,092 | 11/1996 | Abe | 310/359 |
| 5,701,049 | 12/1997 | Kaneyama et al. | 310/359 |
| 5,811,913 | 10/1998 | Kawai | 310/359 |
| 5,818,150 | 10/1998 | Yamamoto | 310/359 |
| 5,872,419 | 2/1999 | Hall et al. | 310/359 |
| 5,903,086 | 5/1999 | Ogiso et al. | 310/359 |

FOREIGN PATENT DOCUMENTS

| 2-262383 | 10/1990 | Japan | H01L 41/09 |
|---|---|---|---|
| 4-206580 | 7/1992 | Japan | H01L 41/107 |
| 06252466 | 9/1994 | Japan | 310/359 |
| 07193293 | 7/1995 | Japan | 310/359 |
| 7-193293 | 7/1995 | Japan | H01L 41/107 |
| 8-107240 | 4/1996 | Japan | H01L 41/107 |

OTHER PUBLICATIONS

Japanese Patent Office Action dated Mar. 2, 1999.
Translation of portions of Japanese Patent Office Office Action dated Mar. 2, 1999.
Shimada, et al., "LCD Backlight Inverter Using Piezoelectric Transformer", NEC, vol. 48, No. 10/1995, pp. 122–126.

Primary Examiner—Thomas M. Dougherty
Attorney, Agent, or Firm—Whitham, Curtis & Whitham

[57] ABSTRACT

A piezoelectric transformer includes strip form electrodes on opposing upper and lower surfaces of a piezoelectric ceramic plate formed by screen printing using a conductive paste. By using strip form electrodes, discharge of a driving portion during polarization, degradation of reliability of mechanical strength due to excessive stress in a power generating portion during polarization, and instability of transformer output due to breakage of the electrode is prevented.

16 Claims, 10 Drawing Sheets

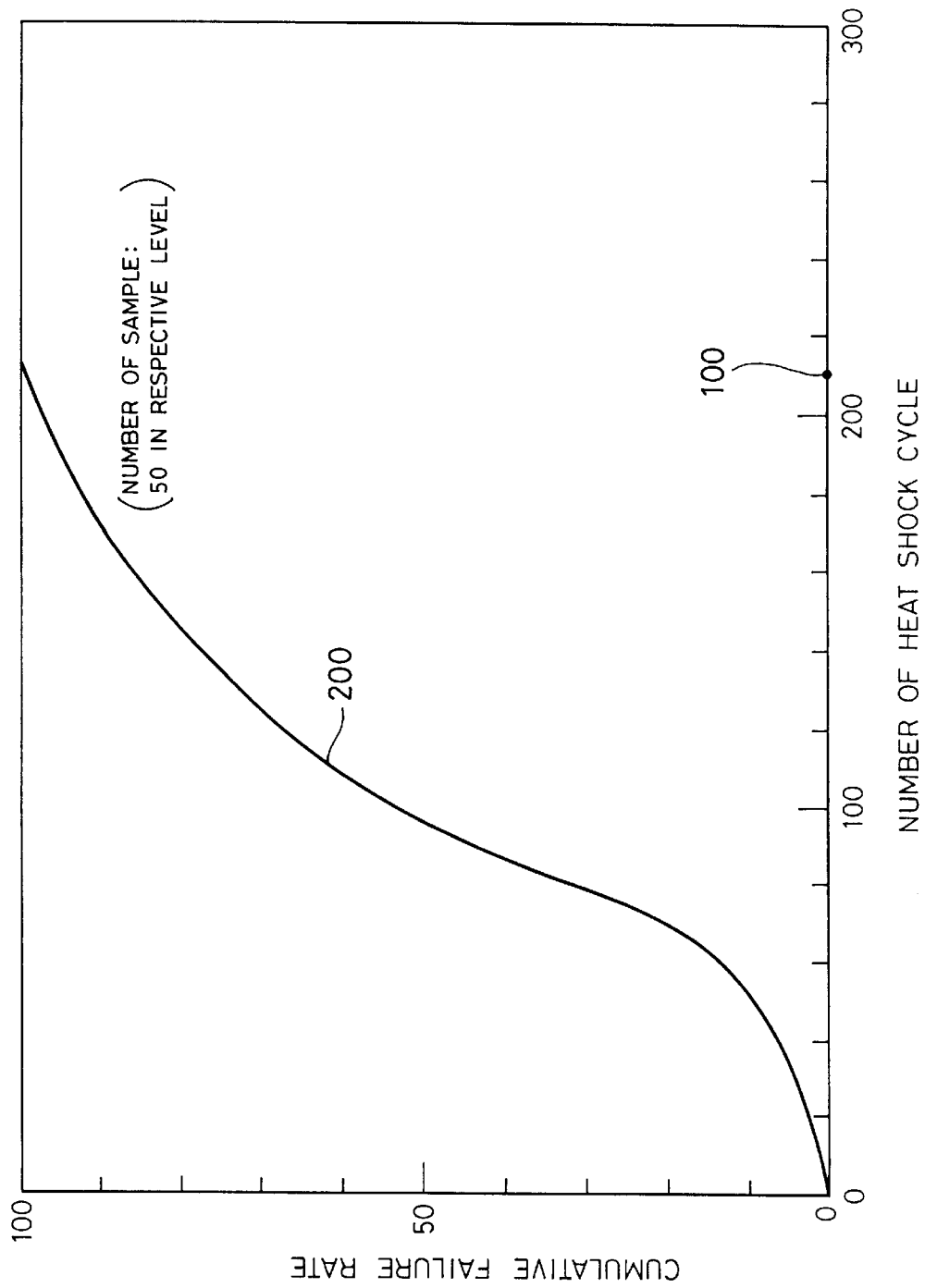

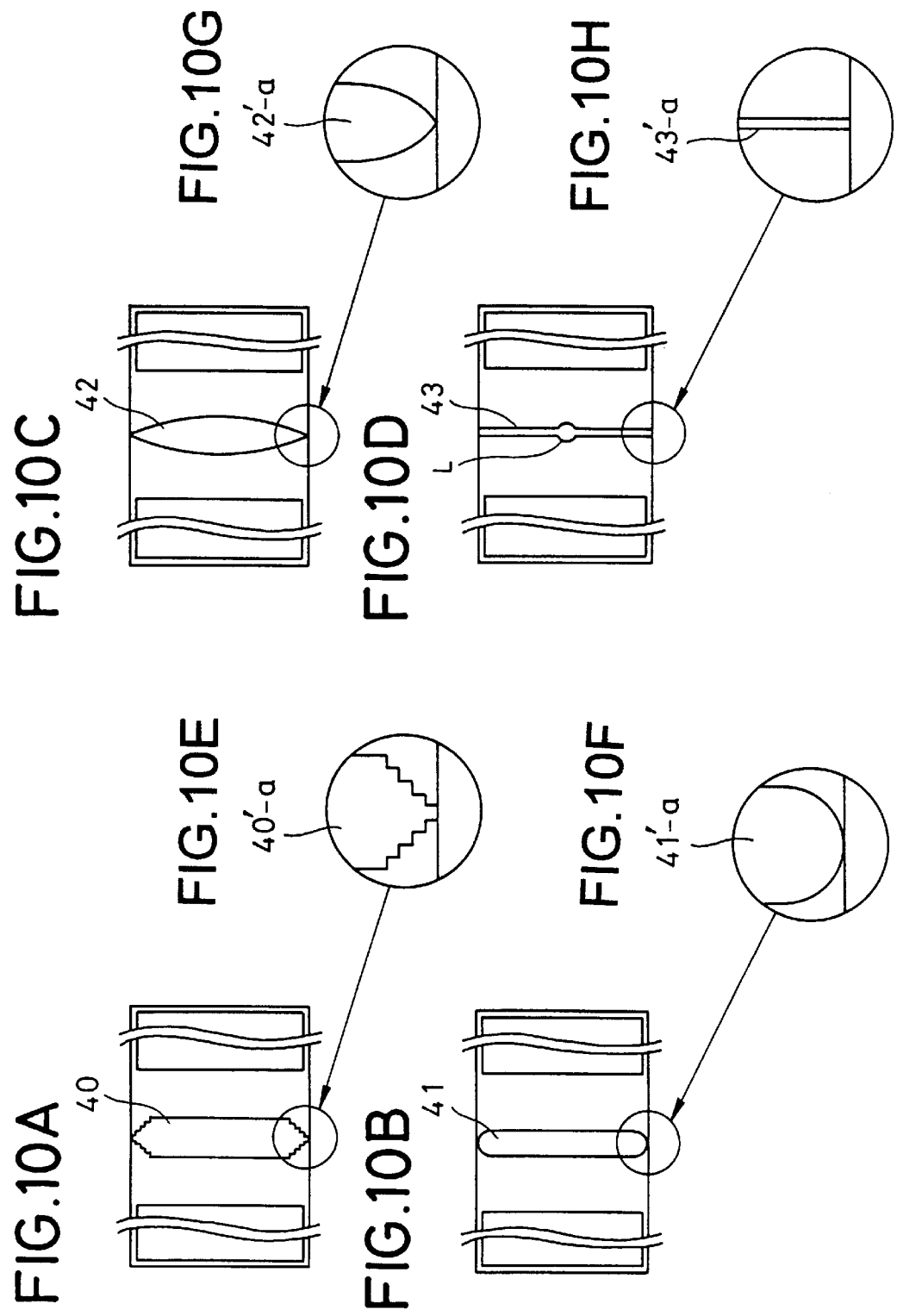

PIEZOELECTRIC TRANSFORMER

BACKGROUND OF THE INVENTION

1. Field of the Invention

The present invention relates generally to a piezoelectric transformer. More specifically, the invention relates to an electrode structure of a piezoelectric transformer, in which an input electrode and an output electrode are provided on a surface of an elongated plate form piezoelectric body.

2. Description of the Related Art

A high power transformer often is employed for a backlight inverter for a liquid crystal display, for example. There has been proposed a piezoelectric transformer which has a completely different operation principle relative to a winding transformer.

FIG. 11 is a perspective view of a piezoelectric transformer, disclosed in Japanese Unexamined Patent Publication (Kokai) No. Heisei 7-193293, as a typical example of the conventional piezoelectric transformer. As shown in FIG. 11, an elongated plate form piezoelectric body 1 is generally separated into three regions of equal length, namely a driving portion 5L, a power generation portion 6 and a driving portion 5R along a longitudinal axis.

On upper and lower surfaces of the driving portion 5L, electrodes 2L and 3L are provided over substantially entire surfaces of respective regions 5L. On upper and lower surfaces of the other driving portion 5R, electrodes 2R and 3R are provided similarly. During a fabrication process, the driving portions 5L and 5R are polarized along an axis in the thickness direction of the piezoelectric body 1, as shown by vertically oriented arrows utilizing the upper and lower electrodes provided respectively.

On the other hand, in the power generating portion 6, at the center portion of the longitudinal axis of this region, a thin electrode 7 is provided extending in the width direction of the piezoelectric body 1 around the circumference. The power generating portion 6 is polarized in mutually opposite directions along the longitudinal axis at a portion on the driving portion 5L side and at a portion on the driving portion 5R across the electrode 7. The polarization is provided during a fabrication process by maintaining the piezoelectric body, on which the electrodes are formed, at high temperature higher than or equal to about 150° C. and by applying a direct current high electric field in the extent of 2 kV/mm to the driving portion and the power generating portion.

At this time, application of necessary electric field is performed in the following manner. Namely, two polarizations are different in polarizing directions, such as thickness direction and longitudinal direction of the piezoelectric body 1, and thus are performed separately. Upon polarization of the driving portion, the electrodes 2L and 2R on the upper surfaces of the driving portions 5L and 5R are shorted to have the same potential. Also, the electrodes 3L and 3R on the lower surface of the driving portions are mutually shorted to be the same potential.

Applying a direct current voltage between the upper electrodes 2L and 2R and the lower electrodes 3L and 3R, an electrical field along thickness axis of the piezoelectric body 1 is applied. On the other hand, upon polarization of the power generating portion 6, upper and lower electrodes 2L, 3L, 2R and 3R are connected to be the same potential. Then, by applying the direct current voltage between the electrode 7 of the power generating portion and the electrodes 2L, 3L, 2R and 3R of the driving portion, mutually opposite directions of electric fields along the longitudinal axis across the electrode 7 are provided by application of the voltage for the piezoelectric body 1.

Boosting a transforming operation in the piezoelectric transformer is performed in the following manner. At first, the electrodes 2L and 2R on the upper surfaces of two driving portions are connected to have the same potential. Similarly, the electrodes 3L and 3R are connected in similar manner. Between upper and lower electrodes, namely between the input terminals 4A and 4B, an alternating current voltage $e_{in}$ is input. By appropriately selecting the frequency of the alternating current input voltage, the piezoelectric body 1 causes mechanical resonation of vertical vibration along the longitudinal axis. The power generating portion 6 due to resonating vibration of the longitudinal axis generates vibration stress corresponding to vibration displacement of the longitudinal axis. Then, by vibration stress and piezoelectric effect by polarization in the longitudinal axis, a charge is generated. Then, the transformed output voltage $e_{out}$ can be obtained between the electrode 7 of the power generating portion and the electrodes 2L and 2R of the driving portion, and namely between the output terminal 8A and the output terminal 8B.

On the other hand, in order to function as a piezoelectric transformer foregoing polarization along the axis in the thickness and polarization along the longitudinal axis are inherent. Furthermore, respective polarizations have to be sufficiently saturated polarization. Therefore, as set forth above, upon polarization during the fabrication process, a strong electric field about 2 kv/mm under atmosphere of 150° C., for example, is applied to the driving portion and the power generating portion of the piezoelectric body. As a result, the following adverse effect should appear.

At first, in the driving portion between upper and lower electrodes 2L and 3L (in case of the left side driving portion 5L, and if in case of the right side driving portion 5R the electrodes 2R and 3R, hereinafter discussion will be given for the case of the left side driving portion 5L), dielectric breakdown occurs which easily causes discharging. This tendency is further accelerated by the following fact. Namely, the electrode on the surface of the piezoelectric body is formed by a thick film method utilizing screen printing in the most case. In this case, at the edge portions of the electrodes 2L and 3L, on the side surface of the piezoelectric body sandwiched between both electrodes, there is easily caused a "run in printing". Once a run in printing is caused, a local concentration of electric field is caused during polarization of the driving portion to easily cause discharging. Normally, polarization is performed within the insulative fluid in order to prevent discharging. However, in a certain magnitude of run in printing or purity of insulative fluid, prevention of discharging can be insufficient.

Once discharging is caused between the electrodes 2L and 3L of the left side driving portion 5L, in an extreme case, the piezoelectric body 1 experiences mechanical breakage. And, even when the extreme case does not exist so that breakage does not occur, a vibration life of the piezoelectric body, which lowers mechanical strength, becomes short. On the other hand, insulation of the input side (driving portion) becomes insufficient to prevent failure when he input voltage is applied.

Next, in the power generating portion, similar to the driving portion set forth above, there is a possibility of discharging. However, as can be seen from experience, a longer distance between the electrodes (distance between the electrodes 2L and 3L of the driving portion and the electrode 7 of the power generating portion) reduces the possibility of discharging. On the other hand, breakage of the piezoelectric body often occurs at the power generating portion during driving, after completion of the transformer. Namely, when the piezoelectric transformer is in operation as a transformer, vibration stress is constantly acting on the piezoelectric body. Normally, the vibrating condition is set so that the vibration stress becomes less than or equal to half of the mechanical strength of the material of the piezoelectric body to avoid occurrence of failure. Despite this, in case of the transformer, in which polarization is successfully completed without causing discharging, the transformer may experience breakage during operation due to the vibration stress. This phenomenon is considered to represent lowering of the mechanical strength due to certain fine damage caused during polarization.

For example, as set forth above, irrespective of either the driving portion or the power generating portion, polarization is performed utilizing the electrode provided on the surfaces in respective regions. Therefore, within a single piece of the elongated plate form piezoelectric body, a portion where mechanical strain is caused due to application of the voltage and a portion where the voltage is not applied and thus this strain is not caused, are present simultaneously. At the boundary between the portions set forth above, large mechanical stress should act. Normally, because the piezoelectric body is ceramic, it can be easily imagined that a micro crack should be caused within the piezoelectric body under the condition of application of the local stress. On the other hand, when chipping due to handling during the fabrication process is present at the edge portion of the elongated plate for the piezoelectric ceramic plate, when vibration stress acts thereon, stress concentration should be caused at the tip end of the crack of chipping to thereby cause the chipping to grow into a crack. Thus, failure in the form of a breakage during operation as transformer can be caused. In such case, breakage during operation is substantially always caused in the power generating portion, as known from experience.

In order to prevent failure associated with polarization, preventing run of a conductive paste during a screen printing process used to form the surface electrode and thus chipping of the piezoelectric body should be effective. For example, Japanese Unexamined Utility Model Publication (Kokai) No. Heisei 6-52161 discloses forming a chamfer on at least the edges along the longitudinal axis among all edges of the elongated plate form piezoelectric ceramic plate. By forming a chamfer, chipping by handling of the piezoelectric body can be prevented, and a run in printing of the electrode of the driving portion can be eliminated.

According to another measure, the shape of the electrode on the surface of the piezoelectric body (plain pattern as viewed in the direction perpendicular to the electrode forming surface) is modified to preliminary form the electrode to a position slightly offset from the edge of the piezoelectric body inwardly. For example, as shown in FIG. 11, by extensively observing the electrodes 2L and 3L of the driving portion 5L, these electrodes are slightly offset from the edge of the piezoelectric body inwardly. By employing such an electrode structure, discharging due to a run in printing, at least upon polarization of the driving portion, and thus the breakage of the piezoelectric body can be prevented.

On the other hand, in the piezoelectric transformer shown in FIG. 11, the electrode 7 at the center or the power generating portion is a loop electrode extending over the entire circumference of the piezoelectric body. The structure of the loop electrode is not directly intended to prevent breakage of the element during driving of the piezoelectric transformer, but can be expected to prevent concentration of an electric field in the vicinity of the output electrode 7, excessive internal stress induced by concentration of the electric field, and generation of a micro-crack at the ceramic in the vicinity of the electrode 7 due to excessive internal stress, and to eliminate possibility that the mechanical strength of the ceramic and breakage of the piezoelectric body during operation of the piezoelectric transformer will be lowered.

This effect has been found by the present inventors and will be discussed hereinafter in detail.

As set forth above, in the conventional piezoelectric transformer, breakage of the piezoelectric body can be avoided by forming a chamfer on the edge of the piezoelectric body or by modifying the electrode structure. However, even in such improved transformer, the following problem can be encountered.

First, Japanese Unexamined Utility Model Publication (Kokai) No. Heisei 6-52161 discloses a transformer provided with a chamfer on the edge of the piezoelectric body. In the transformer, any effect cannot be expected for the micro-crack within the piezoelectric ceramic body generated upon polarization. The processing to form the chamfer should per se cause an increase in the fabrication process and thus serves as a factor that elevates cost. Also, due to difficulty of automating, manual process is inherent to further cause a cost increase.

Next, in the piezoelectric transformer disclosed in Japanese Unexamined Patent Publication No. Heisei 7-193293, it becomes necessary to employ soft electrode material or to form the electrode quite thinner in order to prevent interference from vibration of the electrode of the piezoelectric body. In consideration of industrial production, it should be typical to form Ag electrode or Ag—Pd alloy electrode by screen printing employing the conductive paste.

However, in this method, breakage of the electrode can be easily caused at the ampullar crista of the plate form piezoelectric body. This is because that the conductive paste can be deposited thinner at the ampullar crista. Namely, at the time of production, breakage of the electrode can be caused, or even when breakage of the electrode during fabrication can be avoided, breakage of the electrode of the ampullar crista can be caused due to vibration of transformer during driving of the transformer after completion of fabrication. In either case, breakage of the electrode is caused at two ampullar crista, a performance to concentrate a charge generated in the power generating portion of the transformer to take out, can be lowered. As a result, the transformer cannot satisfy necessary transformer output, nor can it make the transformer output during operation unstable to finally cause fatigue.

On the other hand, in case of a chamfer on the edge portion disclosed in Japanese Unexamined Utility Model Publication No. Heisei 6-52161, no effect for the micro crack within the piezoelectric ceramic generated during polarization, cannot be expected. Furthermore, forming chamfer is per se a factor which increases process steps to thereby increase cost. Also, due to difficulty of automating, a manual process is inherent to causing defects, which even further elevates costs.

Furthermore, Japanese Unexamined Patent Publication No. Heisei 4-206580 discloses a stack structure and thus has a different mechanism in the generation of a micro-crack to that of the single plate. Thus, the invention disclosed in this publication is directed to relax the stress of the interface of the stacked layers between the ceramic portion and the internal electrode portion. On the other hand, assuming that the piezoelectric ceramic transformer of the single plate structure has certain effect in stress relaxation, formation of the electrode over the entire surface is not possible to cause stable polarization for problem of printing run, particularly in the driving portion where less expensive screen printing is employed. Furthermore, even in the power generating portion, a problem of breakage of the transformer due to offset of polarization, localization of the stress associated with offset of polarization should be encountered.

SUMMARY OF THE INVENTION

Accordingly, it is an object of the present invention to provide a piezoelectric transformer, in which an electrode on the surface of a piezoelectric body is formed by less expensive screen printing, and which can avoid instability during polarization due to a run in printing upon formation of the electrode, has high reliability with respect to mechanical strength, such as life against vibration, and has stability in output characteristics.

Another object of the present invention is to provide a piezoelectric transformer which can avoid instability in polarization due to run in printing, to achieve a highly reliable mechanical strength, such as life against vibration and so forth under the premise that the electrode on the surface of the piezoelectric body is formed by an easily employed, low-cost step.

According to one aspect of the invention, a piezoelectric transformer comprises:

a piezoelectric body formed with an elongated plate form piezoelectric ceramic plate divided into a driving portion polarized in a thickness direction and a power generating portion polarized in a longitudinal direction, electrodes formed on surfaces of respective of the driving portion and the power generating portion are respective having electrodes by screen printing of an electrode paste, the electrode of the driving portion being provided paint run upon affecting screen printing with respect to an edge portion of the piezoelectric body; and the electrode of the power generating portion at least including a pair of strip for electrodes formed over the entire width of two major surfaces of the piezoelectric body at positions mutually opposing across the piezoelectric body.

The driving portion may be provided with articulars for mechanical resonation in tertiary mode in the longitudinal direction of the piezoelectric body, at both edge regions, and the power generating portion is provided at the center region the articulars of mechanical resonation of tertiary mode, and the pair of strip form electrodes are positioned at the center portion in the longitudinal direction of a center region.

In the alternative, the driving portion may be provided with articulars for mechanical resonation in tertiary mode in the longitudinal direction of the piezoelectric body, at one of edge regions, and the power generating portion is provided at the center region and the other of edge region the articulars of mechanical resonation of tertiary mode, and the pair of strip form electrodes are positioned at the boundary between said center region and said other of edge region.

In the further alternative, the driving portion may be provided with articulars for mechanical resonation in primary mode in the longitudinal direction of the piezoelectric body, at one of edge region, and the power generating portion is provided at the center region the articulars of mechanical resonation of primary mode, and the pair of strip form electrodes are positioned at the vicinity of the boundary between said one of edge region and said other of edge region.

In the preferred construction, the strip form electrode may have an end portion contacting with an end portion of the major surface of the piezoelectric body in point contact. The end portion of the electrode may be in arc shape, and one point on the arc is in contact with the end portion of the major surface. Alternatively, the end portion of the electrode may be gradually reduced the width in stepwise fashion, and the portion having the minimum width is in contact with the end portion of the major surface The strip form electrode may also be in shape defined by arcs extending between both end portions, and the end portion is in contact with the end portion of the major surface. The end portion of the electrode may be in straight, and the straight end portion is in contact with the end portion of the major surface.

In the piezoelectric transformer according to the present invention, paint runout of screen printing is provided in the electrode of the driving portion to inwardly offset the electrode from the edge (two edges parallel to the longitudinal direction and one edges parallel to the width direction) of the piezoelectric body, preliminary. By this, run of the electrode paste to the side surface of the piezoelectric ceramic plate can be avoided to successfully prevent concentration of the electric field.

Also, creepage of the ceramic plate between the upper and lower electrodes extends through a path being bent in right angle from one of the major surface, extending along the side surface and again being bent in right angle. Therefore, the electric field acting between the input electrodes is deflected. By these effects, possibility of creepage discharge can be remarkably reduced. Namely, polarization of the driving portion can be done stably.

On the other hand, in the power generating portion, the paint runout is not provided and electrode is formed over the entire width of the elongated ceramic plate. Namely, the edge of the ceramic plate (two edges parallel. to the longitudinal direction of the piezoelectric body) and the edge of the electrode are matched with each other. As a result of structural analysis by finite element method performed by the inventor, it has been found that when the paint run is provided in the electrode of the power generating portion, large stress may act on the portion of the paint run during polarization of the power generating portion. It has also been appreciated from finite element method that when the electrode is formed over the entire surface of the piezoelectric body without forming the paint runout, the stress can be significantly reduced. The result of analysis is considered that the electric field is concentrated at the right angle corner portion of the electrode formed by providing the paint runout in the electrode of the power generating portion, to cause large stress on the ceramic plate to cause a microcrack to lower mechanical strength of the piezoelectric body.

Thus, it has been found that it is important not to form the right angle corner in the electrode of the power generating portion. This can be realized by forming the electrode in the power generating portion in loop fashion. However, through experiments, the inventors has found that stress reduction can be achieved even by providing the electrode over the entire width of both major surfaces of the piezoelectric body. By forming the electrode of the power generating portion as proposed by the present invention, it becomes possible to avoid lowering of the transformer output and unstability associating with breakage of the electrode at the ampullar portion of the piezoelectric body which can be caused in the loop form electrode in the power generating portion can be avoided to achieve stable output characteristics.

On the other hand, by partially providing the paint runout of the electrode of the power generating portion to establish point contact between the end portion of the electrode and the end portion of the major surface of the piezoelectric body, amount of run on the side surface of the piezoelectric element can be controlled. By this offset of polarization, and localization of stress upon vibration can be eliminated to prevent break down of the element due to vibration.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to be present invention, but are for explanation and understanding only. In the drawings:

FIG. 3 is an illustration showing a comparison of results of a heat shock test for the first embodiment of the piezoelectric transformer shown in FIG. 1, the conventional piezoelectric transformer shown in FIG. 11, and a piezoelectric transformer for reference in comparison;

FIGS. 10A to 10H are plain views showing various electrode structures; and

DESCRIPTION OF THE PREFERRED EMBODIMENTS

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order to avoid unnecessary obscure the present invention.

Figure 1:
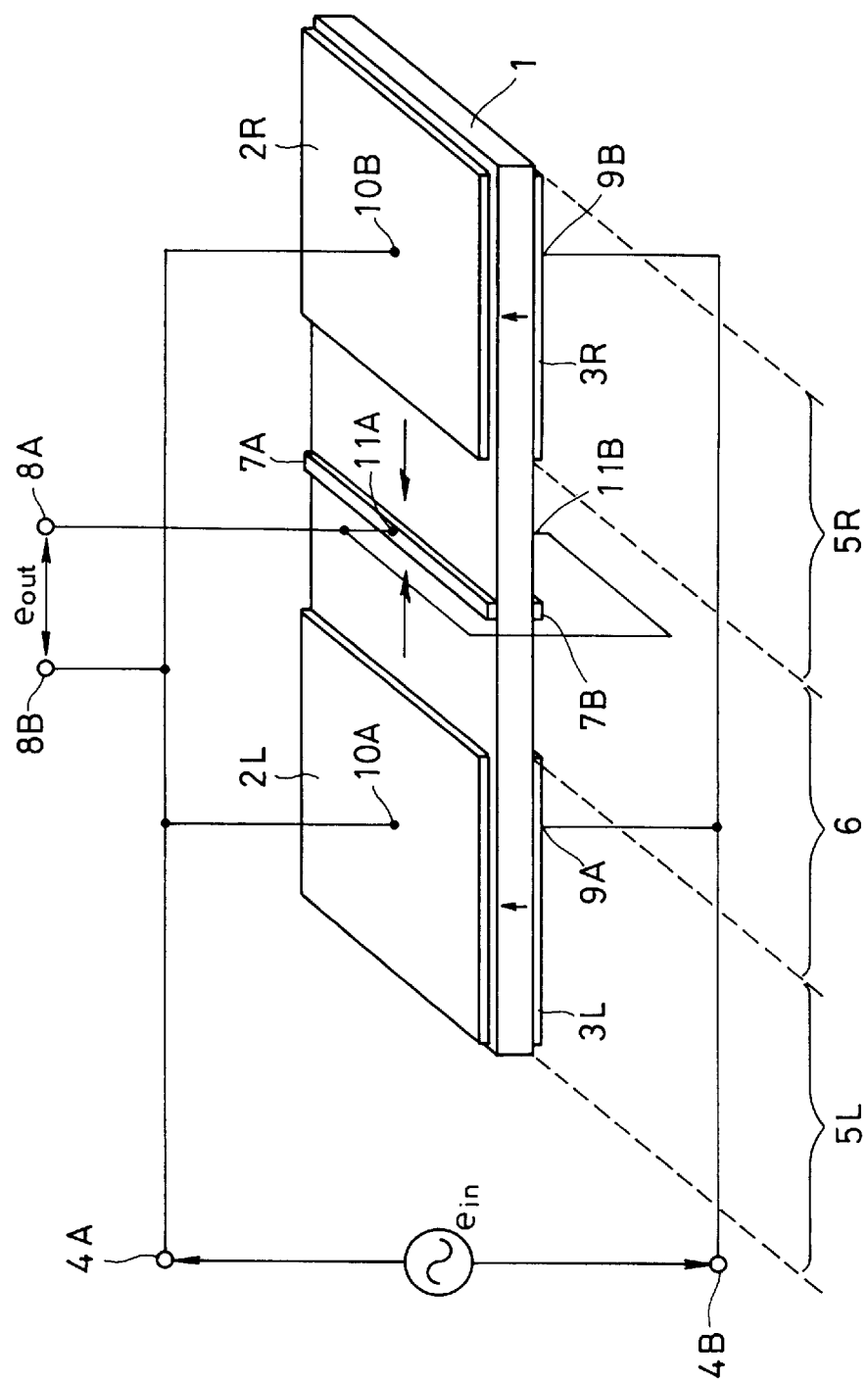
FIG. 1 is a perspective view of the first embodiment of a piezoelectric transformer according to the present invention.
Figure 11:
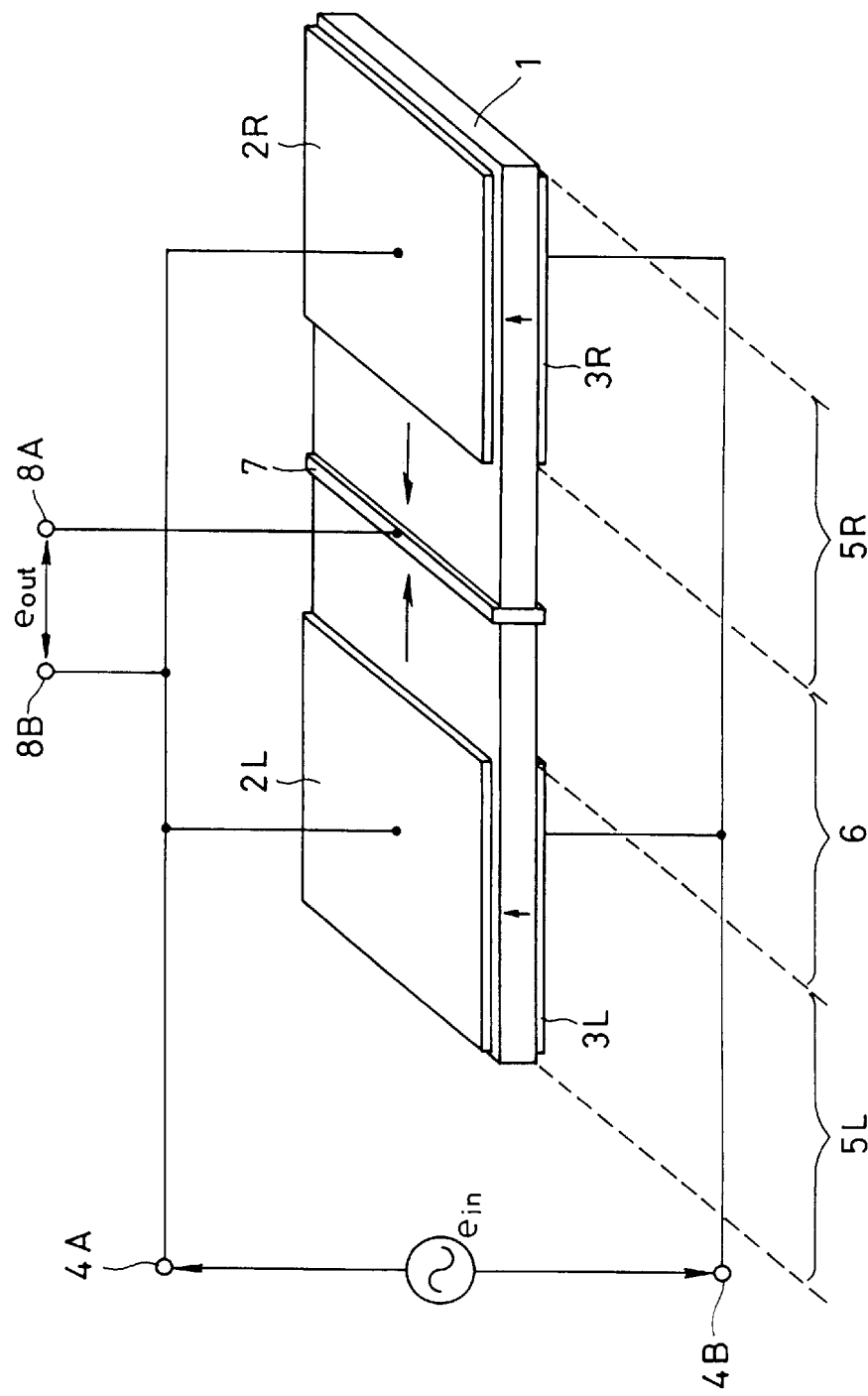
FIG. 11 is a perspective view showing one example of the conventional piezoelectric transformer.

Referring now to drawings, FIG. 1 is a perspective view of the first embodiment of a piezoelectric transformer according to the invention. Comparing FIG. 1 and FIG. 11, the shown embodiment of the piezoelectric transformer is different from the conventional piezoelectric transformer shown in FIG. 11 in structure of electrodes 7A and 7B of the power generating portion. In the power generating portion 6 of the shown embodiment of the piezoelectric transformer, strip form electrodes extending over respective upper and lower major planes of a piezoelectric ceramic plate 1, are provided independently of each other. It should be noted that connecting points 10A, 9A, 10B and 9B between respective external input terminals 4A and 4B on electrodes 2L, 3L, 2R and 3R in the driving portion serve as articulars in vibration of mechanical resonation in tertiary mode in the longitudinal direction of the transformer. Also, the connecting points 4A and 4B between the electrodes 7A and 7B of the power generating portion and the external output terminal 8A serve as articulars for resonation in tertiary mode in the longitudinal direction.

In fabrication of the shown embodiment of the transformer, first, a piezoelectric ceramic material having a large electromechanical coupling coefficient and large mechanical quality coefficient, e.g. NEPEC8 (tradename: Kabushiki Kaisha Tokin), is prepared. A baked body is cut into an elongated plate form of 42 mm length, 10 mm width and 1 mm thickness, to obtain the piezoelectric body 1.

On the surface of the piezoelectric body 1, an electrode pattern of a silver paste is formed by normal thick film screen printing method, and is baked at 600° C. The electrode pattern at the edge portion of the piezoelectric body is shown in FIGS. 2A and 2B in enlarged form.

Figure 2A:
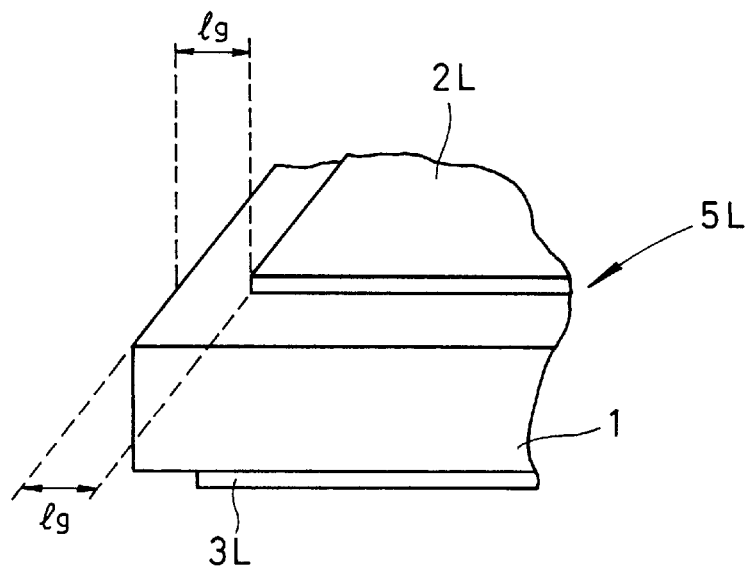
FIGS. 2A and 2B are enlarged illustration showing edge portion of an electrode in FIG. 1.

At first, FIG. 2A is an illustration showing the electrode of the driving portion. As a typical example, the electrodes 2L and 3L of the driving portion 5L is shown. In the electrodes 2L and 3L of the driving portion, for three edges of the piezoelectric body 1 (two parallel edges in the longitudinal direction and one edge in parallel in the width direction), runouts lg of painting of 0.4 mm are provided.

Figure 2B:
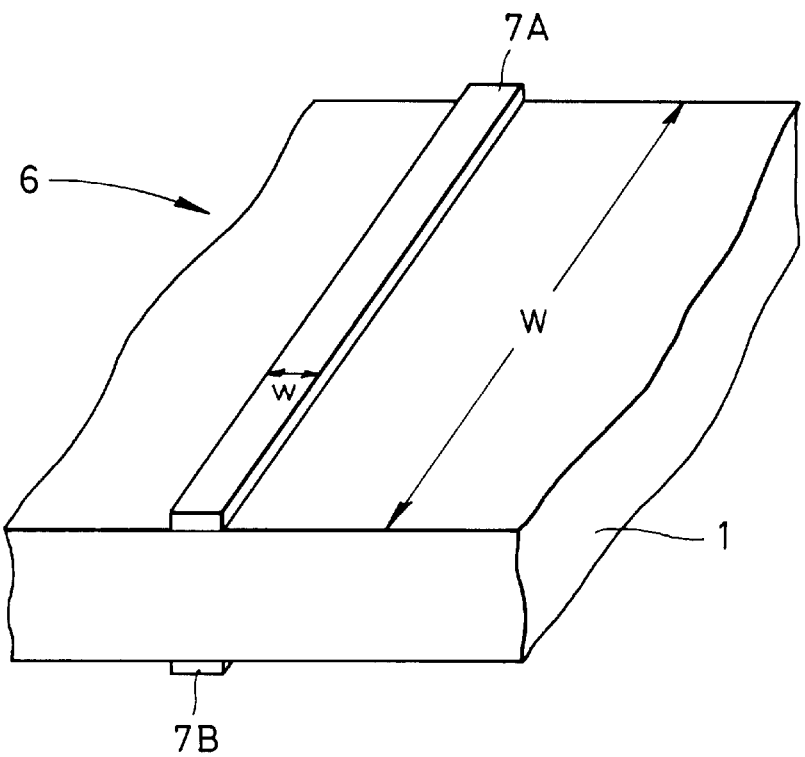

On the other hand, with reference to FIG. 2B shown in the electrodes 7A and 7B of the power generating portion, in the power generating portion 6, over the entire width of the width W=10 mm of the piezoelectric body 1, the strip electrodes 7A and 7B of the width of w=1 mm are formed.

Next, by piezoelectrically activating the piezoelectric body 1 through polarization process, operation as a transformer is enabled. As shown by the arrow in FIG. 1, polarization includes two kinds of polarization in the thickness direction and the longitudinal direction separately per each direction. Respective polarizing conditions are the same. The polarization is performed by applying a direct current electric field of 1.5 kV/mm in insulative fluid heated at 150° C. for 15 minutes.

For polarization in the thickness direction in the driving portion, certainty of discharge in the conventional electrode pattern which does not have runout of painting of the electrode is about 5%, whereas there was no discharge in the pattern provided in the runout of painting of the electrode. The reason is considered that, in the pattern having no painting runout, run in the electrode edge is caused during screen painting in the silver paste. This causes bleeding of the silver paste on the side surface of the piezoelectric body of 1 mm thick, which thereby causes concentration of the electric field to easily discharge. And, whereas by providing painting runout, bleeding of the silver paste on the side surface of the piezoelectric body is prevented to avoid concentration of the electric field. Furthermore, by bending an electric flux line twice at right angles between the upper and lower electrodes 2L and 3L, discharge is significantly reduced.

After completion of polarization, the insulative fluid is washed out, at half positions in the width of the piezoelectric body at the articular of vibration (connection points 10A, 9A, 10B and 9B with respect to the electrodes 2L, 3L, 2R and 3R, and connecting points hA and 11B for the electrodes 7A and 7B, see FIG. 1) and tinned copper wire is soldered to form the external connection terminal.

For the piezoelectric transformer element thus produced, a heat shock test in the following condition is performed. This test becomes a test accelerating the normal operation of the piezoelectric transformer.

(Test Conditions)

(1) Number of Samples 50

(2) Temperature Repeat up and down between −30° C. to 70° C.

(3) Holding Time Held 30 minutes at both −30° C. and −70° C.

(4) Electric Terminal All opened

It should be noted that a transformer in which painting runout of an electrode of 0.4 mm between the edge of the piezoelectric body 1 with respect to the electrode 7A and 7B of the power generating portion and a transformer having an electrode in the power generating portion in a loop structure are added for reference to perform the same heat shock test for comparison purposes. FIG. 3 shows a cumulative failure rate upon repeating a heat cycle up to 200 cycles in this test. With reference to FIG. 3, the transformer provided the painting runout for both of the electrodes 7A and 7B in the power generating portion and the electrodes in the driving portion for comparison reference, has low mechanical strength to cause breakage to cause mechanical breakage in all transformer before 200 cycles (curve 200 in FIG. 3). The comparison reference, the shown embodiment of the transformer and the transformer having the output electrode in loop structure have the same structure and the same fabrication condition except for the electrode pattern in the power generating portion. Therefore, it can be appreciated that the electrode pattern of the power generating portion affects for mechanical strength of the transformer element after polarization (point 100 in FIG. 3).

Observing the broken element, the breaking position in the center in the longitudinal direction of the piezoelectric body 1 causes a crack along the electrodes 7A and 7B in the power generating portion. Therefore, stress analysis in the vicinity of the electrodes of the power generating portion at the center, is performed by finite-element method, taking piezoelectric effect into account. As a result, when the painting runout is provided even on the electrodes of the power generating portion, large stress is caused in the vicinity of an unfilled portion, particularly at the right angle corner portion of the electrode, causing lowering of the mechanical strength, such as crack.

On the other hand, on the piezoelectric transformer element during head shock test, two kinds of stresses act:

(1) heat stress due to heat shock (2) local stress acting on the element due to strain by reverse piezoelectric effect caused by voltage generated from pyroelectric effect.

Breakage of the piezoelectric body is considered to be caused in the transformer, which is lowered the strength by the above-mentioned two kinds of stress. For the electrodes of the power generating portion where the painting runout is not provided, stress acting upon polarization is significantly reduced, thereby preventing a lowering of mechanical strength. In conjunction therewith, the effect of (1) can reduce the stress upon heat shock test, and breakage of the piezoelectric body is quite difficult to cause.

Concerning the piezoelectric transformer after completion of 200 cycles of the heat shock test, normality of transformer operation (boosting transformation) is confirmed. Namely, it has been confirmed that even when the electrode in the power generating portion is not in the loop shape, comparable reliability to the loop shaped electrode could be obtained. Also, even when boosting transformation is continued for about 100 hours, the output of the transformer was stable. On the other hand, in case of the transformer in which the electrode of the power generating portion is in loop shape, instability of 50% of output of the transformer has been found up to the foregoing period. In addition, lowering of the output has been caused in 70% of the transformers, causing instability. For the transformer having a lowered output, breakage of the electrodes has been found in all of such transformers. Namely, for the configuration of the electrode structure of the power generating portion, it has been found that a structure in which electrodes are provided separately on the upper and lower major surfaces over the entire width, rather than the loop structure, had improved performance in terms of reliability. Also, in terms of production costs, the shown embodiment is more advantageous than the loop shape electrode because the former requires a lesser number of process steps.

Figure 4:
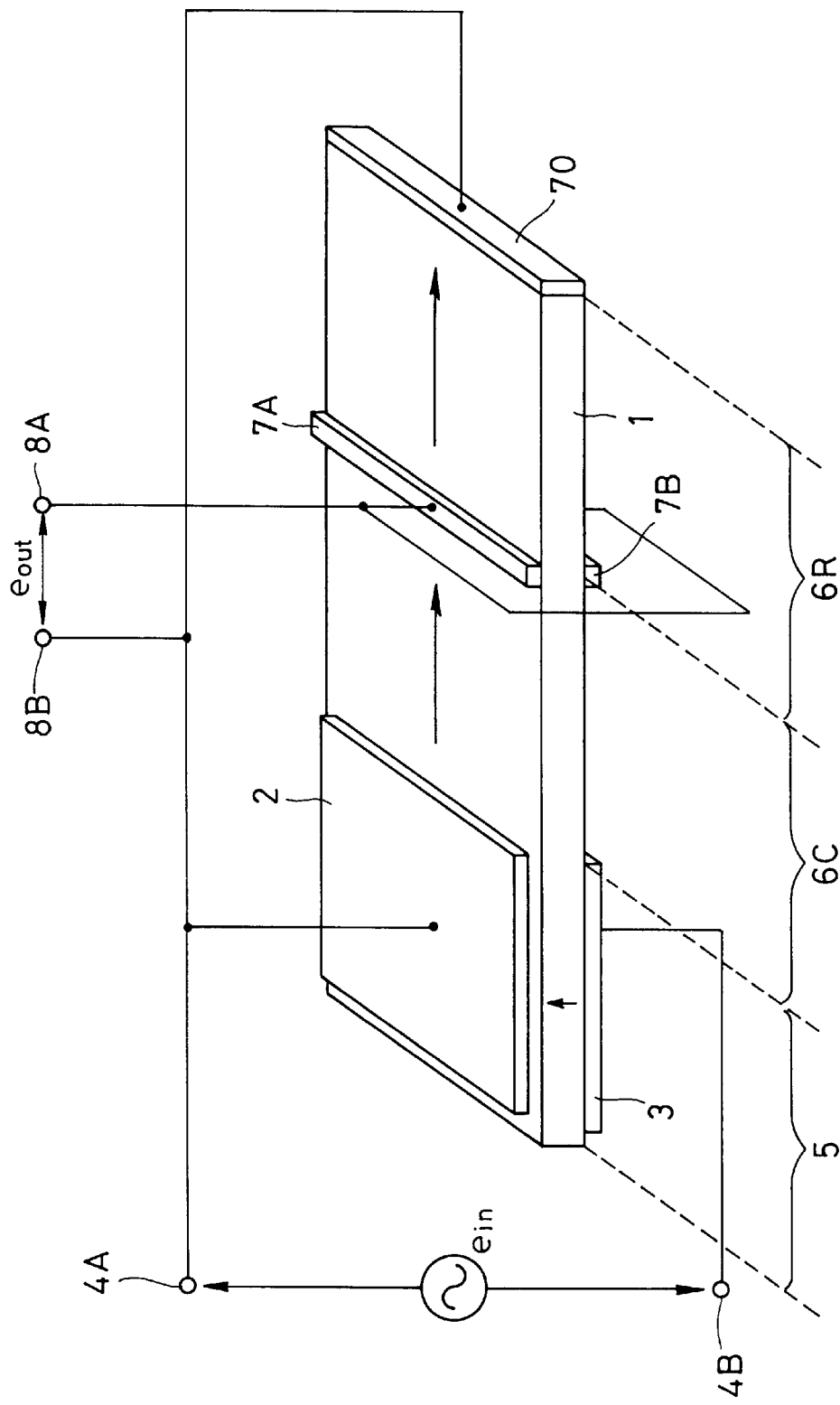
FIG. 4 is a perspective view of the second embodiment of the piezoelectric transformer according to the present invention.

Next, a second embodiment of the piezoelectric transformer according to the present invention will be discussed. FIG. 4 is a perspective view of the second embodiment of the piezoelectric transformer according to the invention. Referring to FIG. 4, the shown embodiment of the piezoelectric transformer has three regions 5, 6C and 6R equally separated in the longitudinal direction. The first region 5 including the end serves as the driving portion, and another two regions 6C and 6R serving as power generating portions. The alternating current is applied to the input terminals 4A and 4B to cause mechanical resonation in the tertiary mode along the longitudinal axis.

The shown embodiment of the piezoelectric transformer is fabricated with the same materials as those used in the first embodiment. Also, the external dimensions of the piezoelectric transformers are the same. However, layout of the driving portion and the power generating portion is different, and as a result the structure of the electrode is different. Namely, in the driving portion 5, electrodes 2 and 3 extend over substantially an entire area of the upper and lower major surfaces. To these electrodes 2 and 3, painting runouts are provided for the electrodes 2 and 3 with respect to the edges of the piezoelectric body 1. On the other hand, in the power generating portion, at the center in the longitudinal direction (boundary between the regions 6C and 6R), the electrodes 7A and 7B are provided on the upper and the lower surfaces.

For these electrodes 7A and 7B, a painting runout is not provided, and thus, both electrodes 7A and 7B are formed over the entire width of the piezoelectric body 1. On the end face of the power generating portion, an auxiliary electrode 70 is formed over the entire area of the end face. The auxiliary electrode 70 is so connected as to have the same potential as that of the electrode 2 of the driving portion. In this transformer, an alternating current input voltage is applied between the electrode 2 of the driving portion and the electrode 70 on the end face and the electrode 3 to cause longitudinal vibration of the piezoelectric body 1 in tertiary mode, to take out a boosted output voltage $e_{out}$ between the electrodes 7A and 7B at the center of the power generating portion. In this case, if the auxiliary electrode 70 on the end face of the power generating portion is not presented, the boosted voltage may reach the only voltage corresponding to the length of the region 6C which is approximately half of the voltage to be obtained from the length of the power generating portion (sum of the length of the region 6C and the length of the region 6R). The auxiliary electrode 70 on the end face of the power generating portion prevents lowering of the output and fully takes out the voltage.

Upon fabrication of the shown embodiment of the piezoelectric transformer, for applying a direct current electric field necessary for polarization of the driving portion and for polarization of the power generating portion, respective electrodes are connected in the following manner.

Namely, for polarizing the driving portion 5, a voltage is applied between the electrodes 2 and 3 of the driving portion in order to apply an electric field in the thickness direction of the piezoelectric body 1. On the other hand, for polarizing the power generating portion, the electrodes 2 and 3 on the surface of the driving portion are shorted to be the equal potential. Then, on the electrodes 2 and 3 and the auxiliary electrode 70, a voltage is applied.

Even in the shown embodiment, a transformer provided with the painting runouts of 0.4 mm at both ends of the electrodes 7A and 7B of the power generating portion is formed as a comparison reference. For the transformer having the structure as illustrated in FIG. 4 and the comparison reference transformer, heat shock test was performed under the same conditions as that in the first embodiment. As a result, similar to the first embodiment, the comparison reference transformer having the painting runout in the electrodes of the power generating portion are all broken during testing. In contrast to this, the transformer in which the output electrodes 7A and 7B are formed over the entire width of the piezoelectric body 1, as shown in FIG. 4, operated normally.

Figure 5:
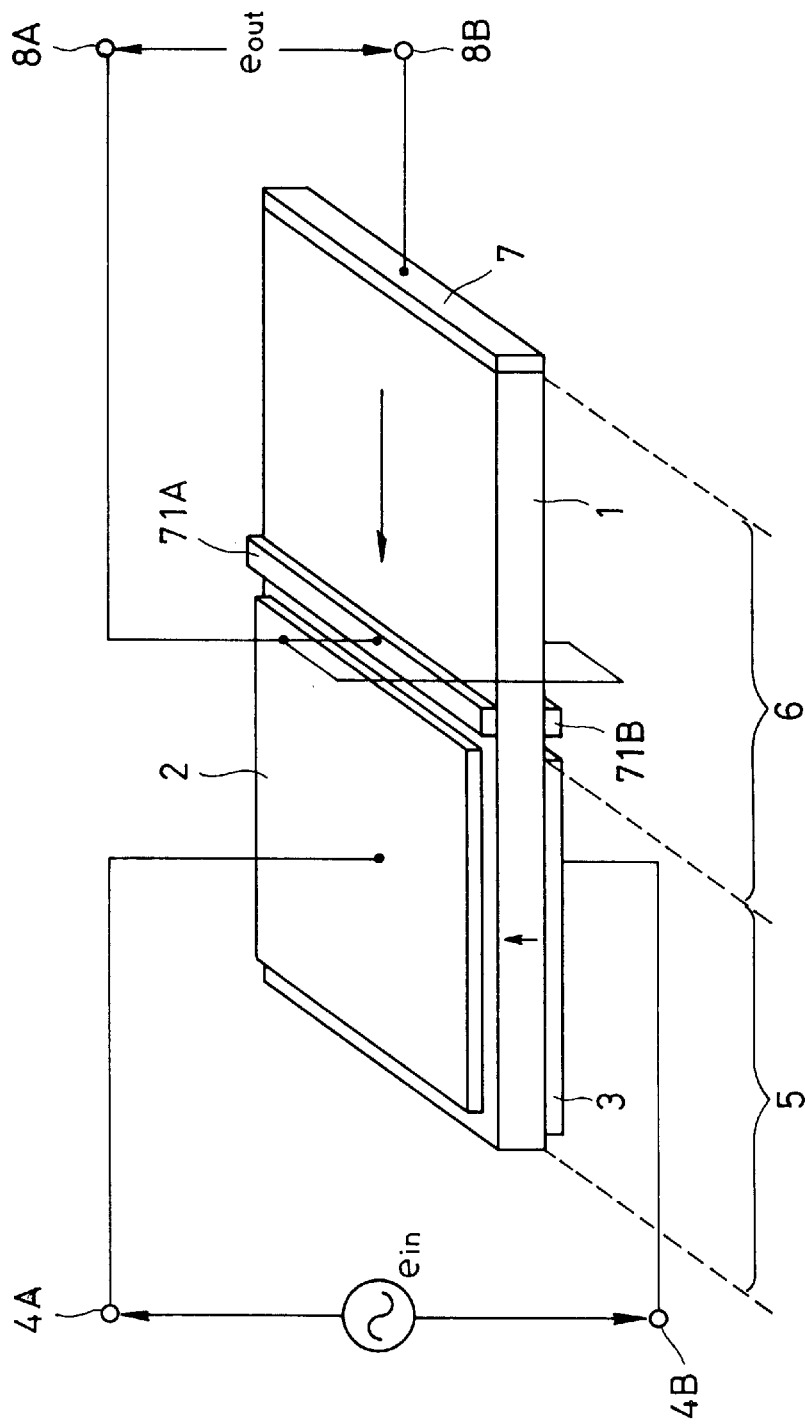
FIG. 5 is a perspective view of the third embodiment of the piezoelectric transformer according to the present invention.

Next, the third embodiment of the piezoelectric transformer according to the present invention will be discussed. FIG. 5 is a perspective view of the third embodiment of the piezoelectric transformer. Referring to FIG. 5, the piezoelectric transformer has two regions 5 and 6 defined by equally dividing the piezoelectric body along the longitudinal axis. One region 5 serves as the driving portion and the other region 6 serves as the power generating portion. The shown piezoelectric transformer is mechanically driven in a primary mode in the longitudinal direction and thus is conventionally known piezoelectric transformer. It should be noted that the conventional piezoelectric body has a three terminal structure, in which is an input terminal and one is an output terminal formed as common terminal. The shown embodiment has a four terminal structure, in which respective input and output terminals are isolated completely with respect to each other. Electrodes 71A and 71B located in the vicinity of the boundary between the power generating portion and the driving portion are auxiliary electrodes required for the four terminal structure. These auxiliary electrodes 71A and 71B are not provided the painting runout, and thus both electrodes 71A and 71B are formed over the entire width of the piezoelectric body 1. While the auxiliary electrodes 71A and 71B are connected to have a mutually equal potential, the potentials on the electrodes 2 and 3 of the driving portion and the output electrode 7 on the end face of the power generating portion are mutually independent of each other. On the other hand, the original output taking out electrode 7 is formed on the end face of the power generating portion and extends over the entire area of the end face. In this transformer, by applying the alternating current input voltage between the electrodes 2 and 3 of the driving portion, the piezoelectric body 1 is driven to cause longitudinal vibration in a primary and basic mode in the longitudinal direction, and the boosted output voltage $e_{out}$ is taken between the electrode 7 of the power generating portion and the auxiliary electrodes 71A and 71B of the power generating portion.

Upon fabrication of the shown embodiment of the piezoelectric transformer, for applying the direct current electric field necessary for polarization of the driving portion and for polarization of the power generating portion during a fabrication process, respective electrodes are connected in the following manner. Namely, upon polarization of the driving portion 5, a voltage is applied between the upper and lower electrodes 2 and 3 of the driving portion to apply an electric field in the thickness direction of the piezoelectric body 1. On the other hand, in polarization of the power generating portion 6, a voltage is applied between the auxiliary electrodes 71A and 71B of the power generating portion and the electrode 7 on the end face of the power generating portion to apply the electric field along the longitudinal axis of the piezoelectric body 1.

In the shown embodiment, a dimension of the piezoelectric body 1 is 35 mm length, 10 mm width and 1 mm thick. Employing NEPEC8 similarly to the first embodiment, Ag electrode is formed on a sintered body by way of screen printing. Even in this case, if painting runout is provided at both ends of the auxiliary electrodes 71A and 71B, concentration of the electric field can be caused on an unfilled right angle corner portion of the auxiliary electrode upon polarization of the power generating portion in the longitudinal direction. As a result, a micro-crack can be formed within the piezoelectric body to degrade reliability of the mechanical strength. Therefore, the auxiliary electrodes 71A and 71B are formed over the entire width. On the other hand, painting runout of the electrodes 2 and 3 of the driving portion is provided with respect to the piezoelectric body 1, polarization in the thickness direction of the driving portion can be done stably with avoiding discharge.

The life against vibration and reliability of the shown embodiment of the piezoelectric transformer can be checked by a heat shock test similarly to the first embodiment. Even when this test was actually performed, no transformer caused breakage during test, and normal operation was maintained even after the test. By this, the effect of providing no painting runout can be confirmed even for the auxiliary electrode.

From the results of the first to third embodiments set forth above, it should be appreciated that by providing the painting runout with respect to the piezoelectric body for the upper and lower electrodes in the driving portion in order to stably perform polarization in the thickness direction of the piezoelectric element and by not providing the painting runout with respect to the piezoelectric body for the electrodes (output electrode or the auxiliary electrode of the power generating portion) to be used for polarization in the longitudinal direction, the same effect can be attained even when the vibration mode and the layout of the electrodes are varied.

Figure 6:
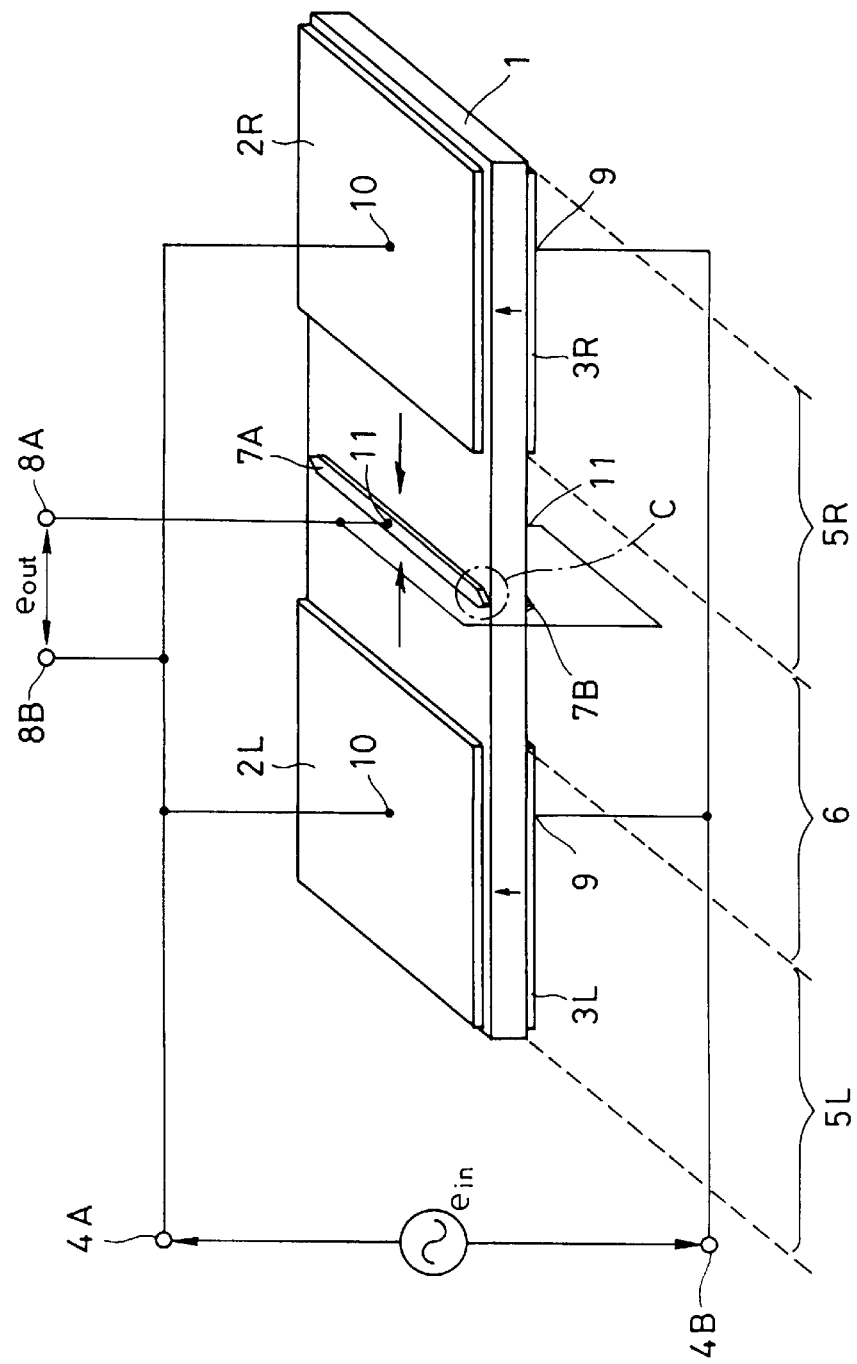
FIG. 6 is a perspective view of the fourth embodiment of the piezoelectric transformer according to the present invention.
Figure 7:
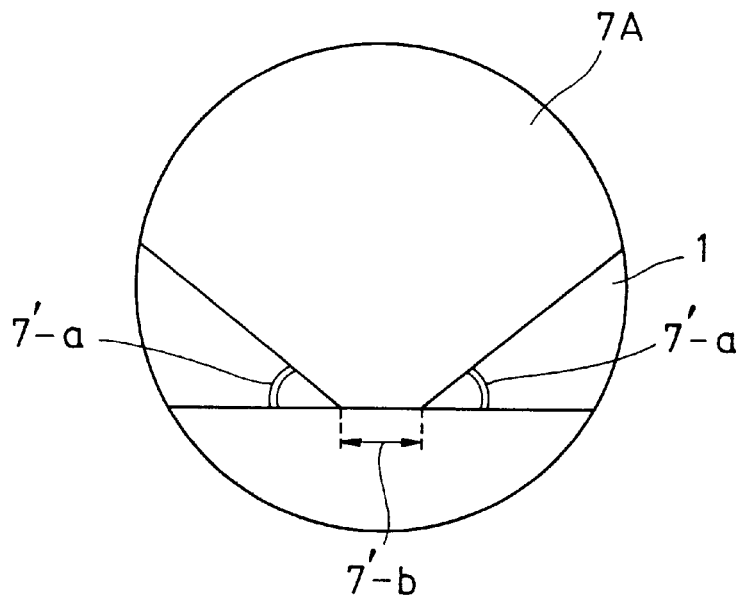
FIG. 7 is an enlarged illustration of a portion C in FIG. 6.

Next, discussion will be given for the fourth embodiment of the piezoelectric transformer according to the invention. FIG. 6 shows the fourth embodiment of the piezoelectric transformer. Referring to FIG. 6, the piezoelectric transformer is different from the piezoelectric transformer shown in FIG. 1 in that the end portion (edge portion) of the electrodes 7A and 7B are in point contact with the end portion of the major surface of the piezoelectric body 1. Namely, as shown in FIG. 7 which is an enlarged illustration of the portion C in FIG. 6, a contact point 7'-b between the end portion of the electrodes 7A and 7B of the power generating portion and the end portion of the main surface of the piezoelectric body 1 is about 0.5 mm. A tilt angle 7'-a at both sides of the contact portion 7'-b is about 10°.

Thus, by forming the end portions of the electrodes 7A and 7B in the power generating portion by screen printing, an amount of the electrode flowing on the side edge of the piezoelectric body 1 can be controlled. In short, in the shown embodiment of the piezoelectric transformer, an amount of electrode paste flowing on the side edge of the piezoelectric body 1 can be reduced to restrict fluctuation of electrode printing.

Figure 8A:
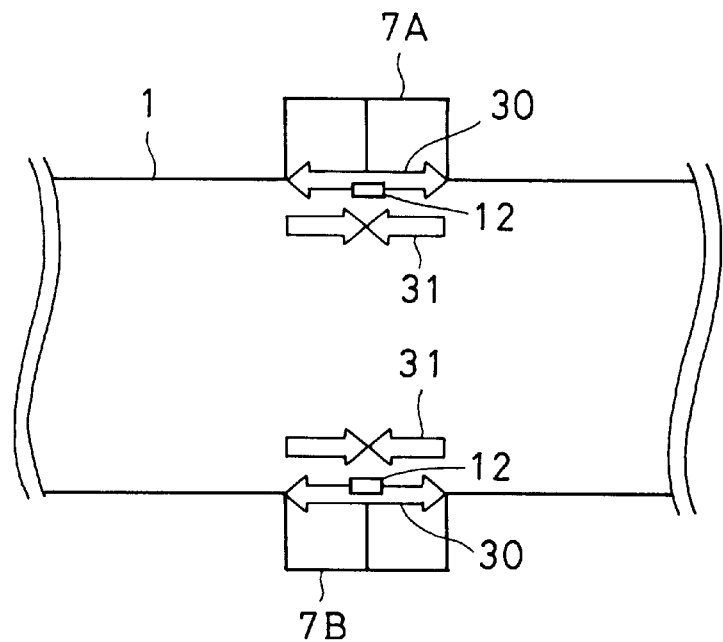
FIG. 8A is a section showing a stress distribution upon baking in the vicinity of run of the electrode of a power generating portion of the piezoelectric transformer of FIG. 6.
Figure 8B:
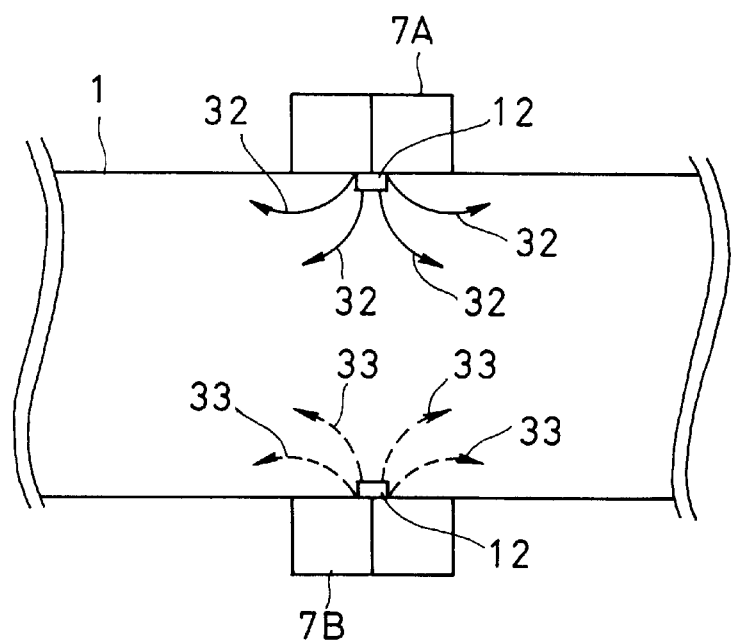
FIG. 8B is section showing a stress distribution upon polarization in the vicinity of run of the electrode of a power generating portion of the piezoelectric transformer of FIG. 6.

Thus, in the shown embodiment of the piezoelectric transformer, the amount of run of the electrode in the power generating portion can be controlled. Therefore, as shown in FIG. 8A which shows a part of the side surface of the piezoelectric body, stress concentration to the end portion of the major surface of the piezoelectric body 1 due to expansion and shrinking of the piezoelectric body 1 and the electrodes 7A and 7B during baking of the electrode can be reduced. Namely, by the run 12 or the electrode, expansion force 30 of the ceramic and expansion force 31 of the electrode is caused during baking of the electrode, but stress concentration due to these force can be successfully reduced. As shown in FIG. 8B, stresses 32 and 33 upon polarization can be reduced to further reduce stress concentration during polarization.

Figure 9:
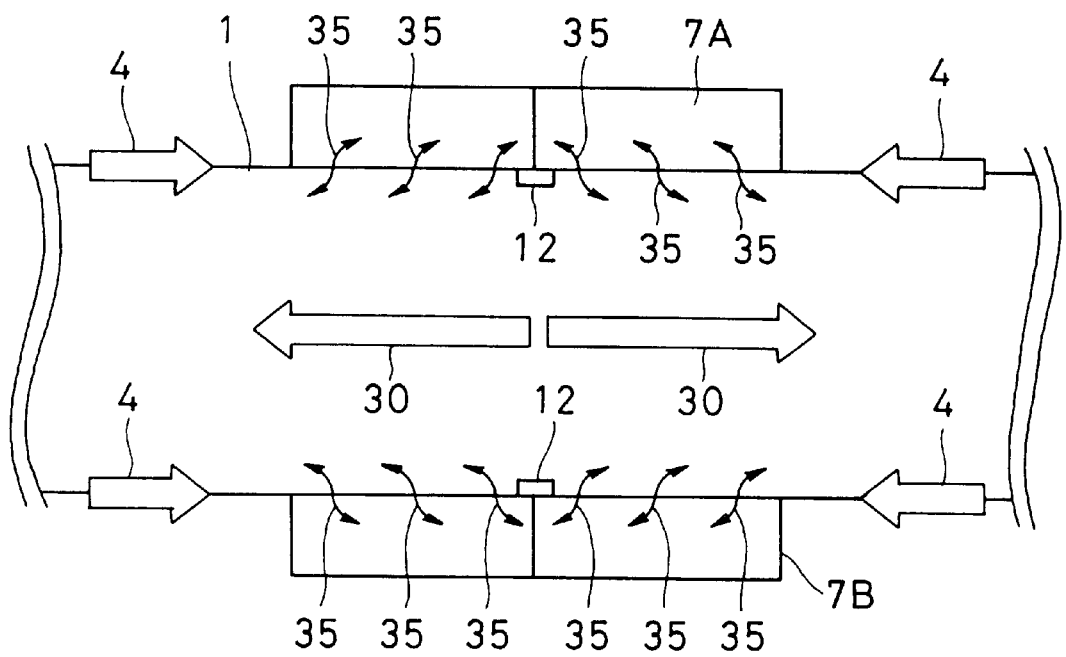
FIG. 9 is a sectional view showing a stress exerted upon baking and a stress distribution in a direction of propagation of a crack in the piezoelectric transformer of FIG. 6.

On the other hand, as shown in FIG. 9, upon heating and cooling, stress 35 applied on the interface between the electrode and the ceramic is generated only on the major surface. Therefore, generation of a micro-crack at the end portion of the major portion of the piezoelectric body 1 which causes element breakage can be restricted. In FIG. 9, an arrow 4 represents a propagating direction of a crack (direction of peeling of the electrode).

As set forth above, since amount of run 12 of the electrode in the power generating portion is controlled, offset of polarization is restricted, making influence of the run of the electrode upon driving smaller.

Here, again referring to FIG. 7, while the contact portion 7'-b has a certain width, it is preferred to make the width as small as possible. Namely, it is ideal to establish point contact between the end portion of the electrodes 7A and 7B of the power generating portion and the end portion of the major surface. Depending upon kind and purity of the material or so forth to be used for the electrode, certain width is caused in certain extent as shown, in practice.

When life of vibration is evaluated with respect to the piezoelectric transformer in the shown embodiment, breakage will not occur, thereby attaining high reliability. On the other hand, when a heat shock test is performed similar to the case of the first embodiment, breakage is not reduced.

As set forth above, by optimizing the electrode structure, flow of the electrode paste on the side surface of the piezoelectric body can be easily controlled at low cost to provide a piezoelectric transformer which vibrates at ideal Rosen tertiary mode and which achieves high reliability.

On the other hand, even when the shape of the electrode of the power generating portion is selected as shown in FIGS. 10A to 10D, a similar effect to the electrode of the power generating portion of the shape, as shown in FIG. 6, could be obtained.

An electrode 40 shown in FIG. 10A has the end portion 40'-a, a width of which is reduced gradually in stepwise fashion. Then, the tip end portion of the end portion 40'-a and the end portion of the major surface of the piezoelectric body 1 are contacted in point contact. The width of the electrode 40 other than the end portion 40⁻-a i5 uniform. By providing such shape of the electrode, the amount of run of the electrode can be controlled to attain the similar effect to the electrode of the power generating portion of the shape illustrated in FIG. 6.

An electrode 41 shown in FIG. 10B has the end portion 41'-a, the width of which is gradually reduced in arc-shaped fashion. Then, the tip end portion of the end portion 41'-a and the end portion of the major surface of the piezoelectric body 1 are contacted in point contact. The width of the electrode 41 other than the end portion 41'-a: is uniform. By providing such a shape of the electrode, the amount of run of the electrode can be controlled to attain a similar effect to the electrode of the power generating portion of the shape illustrated in FIG. 6.

An electrode 42 shown in FIG. bc has a shape in which the tip end portions are connected by arcs. The tip end portion of the end portion 42'-a and the end portion of the major surface of the piezoelectric body 1 are contacted in point contact. By providing such a shape of the electrode, the amount of run of the electrode can be controlled to attain a similar effect to the electrode of the power generating portion of the shape illustrated in FIG. 6.

An electrode 43 shown in FIG. 10D is provided with a land L for certainly providing the contact point with the output terminal. The electrode 43 other than the land L is in thin straight shape. The tip end portion of the end portion 43'-a and the end portion of the major surface of the piezoelectric body 1 are contacted in point contact. By providing such a shape of the electrode, the amount of run of the electrode can be controlled to attain a similar effect to the electrode of the power generating portion of the shape illustrated in FIG. 6. It should be noted that, for convenience of illustration, the portion of the electrode 43 other than the land L appears to have certain width, the width should be as small as possible to enhance the foregoing effect.

In short, even when the electrodes shown in FIGS. 10A to 10D, possibility of causing discharge in the extent of about 5% upon polarization of the piezoelectric ceramic element, otherwise, can be avoided completely. Also, in a heat shock test repeating elevating and lowering the temperature between −30° C. to 70° C., no mechanical breakage was caused up to 200 cycles to perform transformer function. Furthermore, even after testing, output was stable even in continues drive over 100 hours. Since run of the electrode past in the power generating portion can be controlled easily, the piezoelectric transformer with highly reliable electrode structure can be fabricated through reduced process steps to achieve low cost.

As set forth above, the present invention provides the painting runout between the electrode edge and the edge of the piezoelectric body in the driving portion, and the runout of the electrode paste is not provided in the power generating portion to the extent of the electrode over the entire surface. Thus, a piezoelectric transformer which is in and highly reliable in mechanical strength, and which can avoid instability of transformer output due to breakage of the electrode, can be obtained. Also, by controlling run of the electrode paste by establishing point contact between the end portion of the electrode in the power generating portion and the end portion of the major surface of the piezoelectric body, run of the electrode paste can be controlled to realize the highly reliable piezoelectric transformer with ideal Rosen tertiary mode vibration.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A piezoelectric transformer comprising:
   a piezoelectric body including a first edge region, a second edge region, and a center region disposed between said first edge region and said second edge region;
   a driving portion in said first edge region and polarized in a thickness direction;
   a power generating portion in said center region and said second edge region, said power generating portion being polarized in a longitudinal direction; and
   electrodes located on surfaces of respective ones of said driving portion and said power generating portion,
   wherein said electrodes of said driving portion include paint runouts with respect to edge portions of said piezoelectric body, and
   wherein said electrodes of said power generating portion include at least a pair of strip form electrodes located over an entire width of two respective major surfaces of said piezoelectric body at opposing positions across said piezoelectric body,
   wherein said driving portion is provided with nodes for mechanical resonation in tertiary mode in a longitudinal direction of the piezoelectric body, and
   wherein said power generating portion is provided at said center region and said second edge region relative to the nodes of mechanical resonation of tertiary mode, said strip form electrodes being positioned at a boundary between said center region and said second edge region.

2. A piezoelectric transformer as set forth in claim 1, wherein said end portion of each of said strip form electrodes is straight, and said straight end portion is in contact with the end portion of said respective one of said two major surfaces.

3. A piezoelectric transformer as recited in claim 1, wherein said piezoelectric body includes an elongated plate formed form piezoelectric ceramic plate which is divided into said driving portion and said power generating portion.

4. A piezoelectric transformer as recited in claim 1, wherein said paint run is provided upon affecting a screen printing process.

5. A piezoelectric transformer as set forth in claim 1, further comprising:
   an auxiliary electrode disposed along an end face of said second edge region of said piezoelectric body, said auxiliary electrode being connected so as to have a same potential as at least one of said electrodes of said driving portion.

6. A piezoelectric transformer as set forth in claim 5, wherein when alternating current input voltage is applied between said electrodes of said driving portion and said auxiliary electrode to cause longitudinal vibration of said piezoelectric body in tertiary mode, a boosted output voltage between said strip form electrodes is taken out.

7. A piezoelectric transformer as set forth in claim 1, further comprising:
   means for taking out a boosted output voltage between said strip form electrodes when longitudinal vibration occurs in said piezoelectric body in tertiary mode.

8. A piezoelectric transformer, comprising:
   a piezoelectric body including a first edge region adjacent to a second edge region;
   a driving portion in said first edge region and polarized in a thickness direction;
   a power generating portion in said second edge region and being polarized in a longitudinal direction; and
   electrodes located on surfaces of respective ones of said driving portion and said power generating portion,
   wherein said electrodes of said driving portion include paint runouts with respect to edge portions of said piezoelectric body, and
   wherein said electrodes of said power generating portion include at least a pair of strip form electrodes located over an entire width of two respective major surfaces of said piezoelectric body at opposing positions across said piezoelectric body,
   wherein said driving portion is provided with nodes for mechanical resonation in a primary mode in a longitudinal direction of the piezoelectric body,
   wherein said power generating portion is provided within said second edge region relative to the nodes of mechanical resonation of said primary mode, and
   wherein said pair of strip form electrodes are positioned near a boundary between said first edge region and said second edge region.

9. A piezoelectric transformer as set forth in claim 8, further comprising:
   an auxiliary electrode disposed along an end face of said second edge region of said piezoelectric body, said auxiliary electrode being connected so as to have a same potential as at least one of said electrodes of said driving portion.

10. A piezoelectric transformer as set forth in claim 9, wherein when alternating current input voltage is applied between said electrodes of said driving portion and said auxiliary electrode to cause longitudinal vibration of said piezoelectric body in tertiary mode, a boosted output voltage between said strip form electrodes is taken out.

11. A piezoelectric transformer as set forth in claim 8, further comprising:
    means for taking out a boosted output voltage between said strip form electrodes when longitudinal vibration occurs in said piezoelectric body in tertiary mode.

12. A piezoelectric transformer, comprising:
    a piezoelectric body including a driving portion polarized in a thickness direction and a power generating portion polarized in a longitudinal direction; and
    electrodes located on surfaces of respective ones of said driving portion and said power generating portion,
    wherein said electrodes of said driving portion include paint runouts with respect to edge portions of said piezoelectric body,
    wherein said electrodes of said power generating portion include at least a pair of strip form electrodes located over an entire width of two respective major surfaces of said piezoelectric body at opposing positions across said piezoelectric body, and
    wherein each of said strip form electrodes has a tapered end portion in point contact with an end portion of a respective one of said two major surfaces of said piezoelectric body.

13. A piezoelectric transformer as set forth in claim 12, wherein said driving portion is provided with nodes for mechanical resonation in tertiary mode in a longitudinal direction of the piezoelectric body at two edge regions, wherein said power generating portion is provided at a center region relative to the nodes of mechanical resonation of tertiary mode, and wherein said pair of strip form electrodes are positioned at a center portion in the longitudinal direction of said center region.

14. A piezoelectric transformer, comprising:

a piezoelectric body including a driving portion polarized in a thickness direction and a power generating portion polarized in a longitudinal direction; and electrodes located on surfaces of respective ones of said driving portion and said power generating portion, wherein said electrodes of said driving portion include paint runouts with respect to edge portions of said piezoelectric body, wherein said electrodes of said power generating portion include at least a pair of strip form electrodes located over an entire width of two respective major surfaces of said piezoelectric body at opposing positions across said piezoelectric body, wherein each of said strip form electrodes has an end portion in contact with an end portion of a respective one of said two major surfaces of said piezoelectric body, and wherein said end portion of each of said strip form electrodes is in an arc shape, and one point on the arc is in contact with the end portion of said respective one of said two major surfaces.

15. A piezoelectric transformer, comprising:

a piezoelectric body including a driving portion polarized in a thickness direction and a power generating portion polarized in a longitudinal direction; and electrodes located on surfaces of respective ones of said driving portion and said power generating portion, wherein said electrodes of said driving portion include paint runouts with respect to edge portions of said piezoelectric body, wherein said electrodes of said power generating portion include at least a pair of strip form electrodes located over an entire width of two respective major surfaces of said piezoelectric body at opposing positions across said piezoelectric body, wherein each of said strip form electrodes has an end portion in contact with an end portion of a respective one of said two major surfaces of said piezoelectric body, and wherein said end portion of each of said strip form electrodes is gradually reduced in width to form a stepwise configuration, and a portion having a minimum width in said stepwise configuration is in contact with the end portion of said respective one of said two major surfaces.

16. A piezoelectric transformer, comprising:

a piezoelectric body including a driving portion polarized in a thickness direction and a power generating portion polarized in a longitudinal direction: and electrodes located on surfaces of respective ones of said driving portion and said power generating portion, wherein said electrodes of said driving portion include paint runouts with respect to edge portions of said piezoelectric body, wherein said electrodes of said power generating portion include at least a pair of strip form electrodes located over an entire width of two respective major surfaces of said piezoelectric body at opposing positions across said piezoelectric body, wherein each of said strip form electrodes has an end portion in contact with an end portion of a respective one of said two major surfaces of said piezoelectric body, and wherein each of said strip form electrodes is in a shape defined by arcs extending between said end portion of said strip form electrode and said end portion of said respective one of said two major surfaces, and wherein said end portion of each of said strip form electrodes is in contact with the end portion of one of said two major surfaces.

* * * * *